United States Patent [19]

Matthey

[11] 4,084,131
[45] Apr. 11, 1978

[54] PROCESS AND APPARATUS FOR THE DETERMINATION OF THE INVERSION TEMPERATURE OF A QUARTZ PIEZOELECTRIC RESONATOR ELEMENT

[75] Inventor: Hubert Matthey, Brugg, Switzerland

[73] Assignee: Societe Suisse pour l'Industrie Horlogere Management Services, S.A., Bienne, Switzerland

[21] Appl. No.: 729,636

[22] Filed: Oct. 5, 1976

[30] Foreign Application Priority Data

Sep. 27, 1975 Switzerland .................... 13863/75

[51] Int. Cl.² .......................................... G01R 29/22
[52] U.S. Cl. ................................................ 324/56
[58] Field of Search .............. 324/56, 57 Q; 73/339 A

[56] References Cited

U.S. PATENT DOCUMENTS

| | | | |
|---|---|---|---|
| 2,178,225 | 10/1939 | Diehl et al. | 324/56 |
| 2,470,737 | 5/1949 | Bach | 324/56 X |
| 2,691,111 | 10/1954 | Minnich | 324/56 X |
| 3,530,377 | 9/1970 | Tanzman | 324/56 |
| 3,916,303 | 10/1975 | Butuzov et al. | 324/56 |

Primary Examiner—Gerard R. Strecker
Attorney, Agent, or Firm—Griffin, Branigan and Butler

[57] ABSTRACT

The inversion temperature of a quartz piezoelectric resonator is determined by exciting the resonator at its resonant frequency, bringing the resonator to a first temperature $T_h$, obtaining the resonance frequency $f_o$ at the temperature $T_h$ as a standard of comparison for the subsequent measurement of resonator frequency variations, bringing the resonator to a second temperature $T_f$ and measuring the relative frequency spread $(f - f_o/f_o)$ while the temperature is varying from $T_h$ to $T_f$, detecting the maximum value of the frequency spread, and deducing the temperature at which the maximum value occurs. One of the first and second temperatures is greater and the other is less than the inversion temperature.

9 Claims, 6 Drawing Figures $K_2 = 4 \cdot 10^{-8} /°C^2$ $T_h = 55 °C$

PROCESS AND APPARATUS FOR THE DETERMINATION OF THE INVERSION TEMPERATURE OF A QUARTZ PIEZOELECTRIC RESONATOR ELEMENT

The invention relates to a process and an apparatus for determining the inversion temperature of quartz piezoelectric resonator elements.

In a general manner it is known that the frequency of a quartz resonator depends on temperature according to a complex function which one may express in the form of a series development:

$$f = f_o(a_o + a_1T + a_2T^2 + \ldots + a_nT^n \ldots)$$

where $f$ represents the frequency, $f_o$ a reference frequency, $T$ the temperature and $a_o$, $a_1$, etc. to $a_n$ suitable coefficients.

For resonators for which the quartz element is cut according to precise dimensional relationships in a predetermined orientation relative to the crystallographic axes and which vibrates according to a particular mode, certain coefficients $a_n$ may become very small. One may then neglect the corresponding terms within a limited range of the temperature variation and the relationship will be simplified as a result thereof.

For example for the majority of quartz resonators utilized for frequencies below 1 MHz the terms of order $n$ above 2 may be neglected in the neighborhood of the ambient temperature and one obtains for the relative frequency drift as a function of the temperature a formula in the form:

$$(f - f_o/f_o) = \Delta f/f_o \simeq K_o + K_1T + K_2T^2$$

This law may be represented graphically as a parabola for which the axis of symmetry is parallel to the ordinate. The coefficient $K_o$ corresponds to the frequency spread at the origin of the temperature axis. $K_1$ depends for a given resonator on the orientation of the active element of the resonator relative to the crystallographic axes of the quartz as well as the dimensional relationships. $K_2$ depends above all on the mode of vibration which is utilized and to a lesser extent on the orientation and the dimensional relationships. $K_2$ corresponds to the width of opening of the parabola and its sign, normally negative, indicates that the concavity is directed towards the bottom.

The slope of the parabola becomes zero for a special value $T_o$ of the temperature referred to as the temperature, or point, of inversion and represents thus the temperature in the neighborhood of which the resonator offers the greatest frequency stability relative to temperature variations. It may thus be readily seen that an interest resides in the determination with sufficient precision of this inversion point, that is to say the temperature for which the frequency of the resonator will have its maximum stability.

The determination of $T_o$ from measurements directly made on a given resonator necessitates normally obtaining the coordinates ($\Delta f/f_o$, T) of three points which leads to a system of equations in three unknowns which when solved, gives the values $K_o$, $K_1$, $K_2$. The equation of the parabola approximating the function is from that moment known and it suffices to take the derivative thereof relative to T in order to determine the point of inversion $T_o$.

Practically putting into practice such a method requires either three enclosures maintained at different temperatures or one enclosure capable of varying among three programmed temperatures.

One may multiply as frequently as desired the number of points determined ($\Delta f/f_o$, T) between two given limits and the redundance thereby introduced permits observation of the anomalies in the behaviour of the frequency-temperature relationship of the resonator due, for example, to coupling with undesirable vibration modes or to unforeseen effects in the suspension arrangements. In extending the number of measurements towards the infinite one obtains a graphical recording of a continuous nature of the relationship frequency-temperature. If $T_o$ is between a lower and an upper limit of the temperature, one may then find the inversion point by means of a single glance.

Obtaining the inversion temperature $T_o$ by the point determination method takes a great deal of time in view of the thermal inertia of the enclosure having a programmed temperature or the transfer of the resonator from one enclosure to another when several are used. Moreover, except for the case of continuous graphical recordings the data so obtained must thereafter be treated by the methods of calculus in order to obtain the result sought after. Such techniques are thus badly adapted to the situation where one wishes to obtain results within a short time period, as is the case for the inspection of resonators fabricated in large series.

And object of the invention is to overcome these difficulties and as a consequence proposes a process and an apparatus for determining rapidly the inversion temperature of identical quartz resonator elements manufactured in large series.

The invention will be better understood in the light of the following description and the accompanying drawings in which:

FIG. 1 is a graphical representation showing the relative frequency variation $\Delta f/f_o$ as a function of temperature, FIG. 2 is a graphical representation of the difference in relative variation of frequency $\Delta T$ between a temperature T and the temperature $T_o$, FIG. 3 is a schematic representation of an apparatus for putting into practice the invention, FIG. 4 is a schematic drawing of the principle used in the determination of the inversion point according to the invention, FIG. 5 shows a particular example of the calibration curve of the apparatus, FIG. 6 represents the graduation of a dial of the measuring instrument utilized for determining the inversion point.

The number of points ($\Delta f/f_o$, T) necessary for the determination of the curve as a function of the temperature may be reduced to two if one of them coincides with the inversion temperature $T_o$ and if the coefficient of the term of the second degree of the equation of the parabola is known (see FIG. 1).

Effectively, for temperature $T_o$ the derivative relative to the temperature T becomes zero $$\left[\frac{d}{dT}\left(\frac{\Delta f}{f_o}\right)\right]T = T_o = (K_1 + 2K_2T) T = T_o = K_1 + 2K_2T_o$$

whence $K_1 + 2K_2T_o = 0$, and consequently $K_1 = -2K_2T_o$.

This expression for $K_1$ when introduced into the relationship giving $(\Delta f/f_o)$ leads to $(\Delta f/f_o) = K_o - 2K_2T_oT + K_2T^2$ whereby for $T_o$, $$\left(\frac{\Delta f}{f_o}\right) T = T_o = K_o = K_2T_o^2$$

The difference of the relative variation of frequency $\Delta T$ existing between the temperature $T$ and the temperature $T_o$ is written $$\Delta_T = \frac{\Delta f}{f_o} - \left(\frac{\Delta f}{f_o}\right) T = T_o = K_2(T - T_o)^2$$

This function is represented in FIG. 2.

If the relative variation of frequency $\Delta_T = \Delta$ existing between a temperature $T = T_h$ supposedly known and the temperature $T_o$ supposedly unknown is determined, the relationship becomes $\Delta = K_2 (T_h - T_o)^2$, equation which when solved for $T_o$ gives: $T_o = T_h \pm \sqrt{\Delta/K_2}$.

In summary, for a resonator for which the constant $K_2$ is known the determination of $T_o$ comes down to the measure of a fixed temperature $T_h$ and of the frequency variation relative thereto existing between $T_h$ and $T_o$. For $T_h$ chosen greater than $T_o$ the sign in front of the root is the "minus" sign, for $T_h$ smaller than $T_o$ the "plus" will apply.

The present invention is based on the following assumptions:

for identical resonators which have been carefully made, the frequency changes parabolically with temperature according to the law $\Delta_T = K_2 (T - T_o)^2$ an expression in which $K_2$ is known, constant and reproducible;

if the temperature $T$ is a function of time $\psi (t)$ the frequency changes according to the law $\Delta_T = K_2 \psi (t) - T_o^2$ on the condition that the speed of change $d/dt [\psi (t)]$ of the temperature be sufficiently low that one may neglect the effect of the thermal time constants of the resonator.

FIG. 3 shows an arrangement according to the invention for putting into practice the process just described. A support comprises two heat sources 1 and 2 which may be brought to different temperatures. They are provided with planar thermal contact surfaces 3 and 4 situated in the same plane and mechanically intercoupled by a slide-way 5 along which may be displaced a cursor 6 provided with an opening 7 for a resonator 8 to be measured. The resonator 8 may thus be maintained in intimate contact with one or the other of the thermal contact surfaces 3 or 4. The cursor 6 is provided with electrical contacts 9 for the terminals of the resonator as well as a flexible coupling cable 10 which assures connection of the resonator with a fixed measuring apparatus for any position of the cursor along the slide-way 5.

The measuring circuit illustrated in FIG. 4 comprises an electronic circuit 11 capable of maintaining resonator 8 in resonance oscillation, a frequency comparator 12 measuring the variation between frequency $f$ of resonator 8 and the reference frequency $f_o$ supplied by a generator 13, and a display circuit 14. Generator 13 has at its output 15 a signal of which the frequency $f_o$ may be adjusted in a limited range about a nominal value by a regulating member 16. Comparator 12 delivers at its output line 17 a signal in the form of a continuous DC voltage proportional to the frequency variation $\Delta f = f - f_o$ and thus to the relative frequency variation $\Delta f/f_o$, the magnitude of frequency $f_o$ being considered as a calibration constant.

The display circuit 14 comprises a diode 18 for which the forward voltage drop may be neglected and through which the output voltage of comparator 12 is applied to the terminals of a capacitor 19 serving as a memory.

Capacitor 19 may be discharged through a resistance 20 put into the circuit by a switch 21. A high input impedance amplifier 22 connects capacitor 19 to a moving coil instrument 23 calibrated by means of a resistance 24. Instrument 23 shows a displacement proportional to the voltage developed at the terminals of capacitor 19 with negligeable current consumption.

The determination of the inversion temperature $T_o$ of the resonator may be carried out in the following manner:

The heat sources 1 and 2 (FIG. 3) are brought respectively to the temperature $T_h$ chosen to be greater than the nominal inversion temperature $T_o$ and maintained constant, and to a temperature $T_f$ of which the only necessary condition is that it be inferior to $T_o$. The inversion temperature $T_o$ is thus situated somewhere between $T_h$ and $T_f$.

The resonator 8 is placed into opening 7 of cursor 6 and maintained in resonance by circuit 11. The resonator is then brought into contact with the heat source at temperature $T_h$. Its frequency will tend progressively towards a value $f_h$ which will finally become constant (see FIG. 2).

Switch 21 (FIG. 4) is closed, the frequency $f_o$ of the reference generator 13 is adjusted by means of the adjusting element 16 so that $f_o = f_h$, comparator 12 supplies zero voltage at its output 17 and the displacement of instrument 23 is also zero. When the resonator has attained its equilibrium temperature equal to $T_h$ the zero thus obtained remains stable. The initial adjustment of the apparatus is then complete.

This adjustment having been made, the switch 21 is opened, and resonator 8 brought into thermal contact with the second heat source at temperature $T_f$ by movement of the cursor 6 along the slide-way 5. The frequency $f$ of the resonator then tends to change to a new value $f_f$ (see FIG. 2). Comparator 12 supplies at its output 17 a voltage proportional to $\Delta f/f_o$ and of a polarity such that the diode 18 applies it to the terminals of capacitor 19 and through amplifier 22 to instrument 23 which will show a corresponding movement.

As soon as the inversion temperature $T_o$ is reached the relative variation of frequency passes through its maximum value $\Delta$ and the corresponding output voltage from comparator 12 is stored in capacitor 19 while instrument 23 indicates again the corresponding movement.

The temperature change continues towards $T_f$ after having passed by the value $T_o$. The frequency variation decreases as well as the output voltage of comparator 12.

The capacitor 19 cannot be discharged across diode 18 which is blocked and thereby stores the maximum voltage attained corresponding to the relative frequency variation $\Delta$. Instrument 23 maintains its corresponding displacement. It is thus sufficient to graduate the scale of instrument 23 as a function of the voltage at the terminals of capacitor 19 according to the relationship indicated above: $T_o = T_h - (\Delta/K_2)$.

Constant $K_2$ is assumed equal to the average value for the type of resonator being measured. This type is known and is the object of manufacture in mass production.

Figure 1:
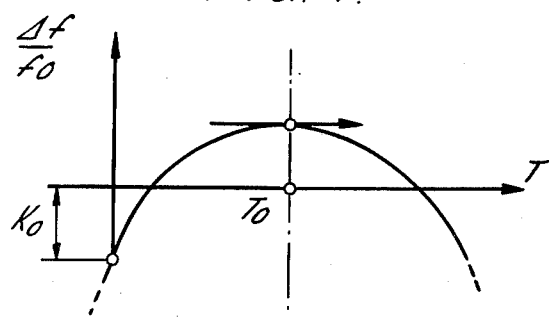
Figure 2:
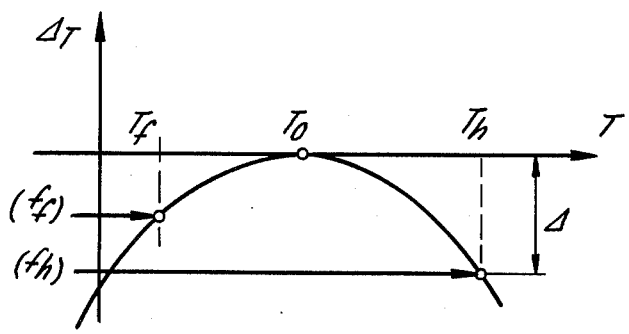
Figure 3:
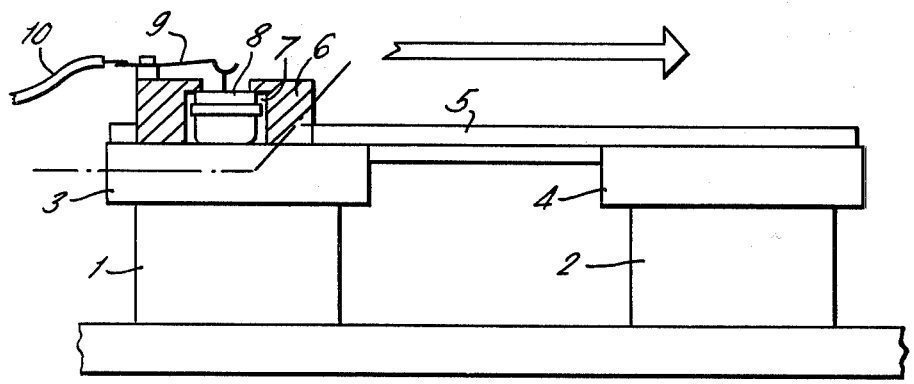
Figure 4:
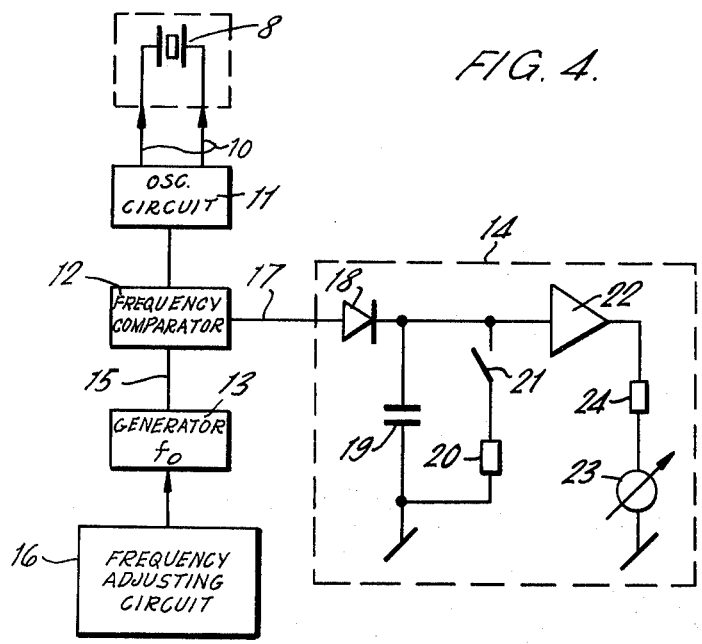
Figure 5:
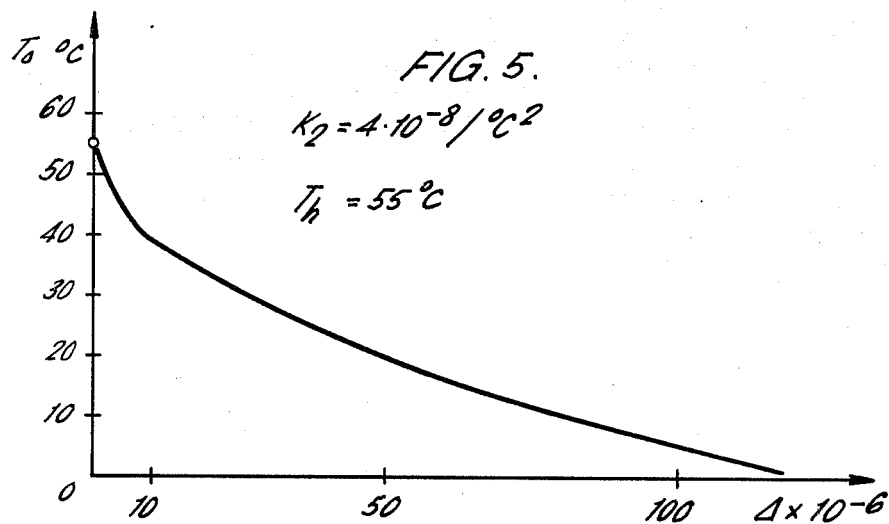
FIG. 5 shows a calibration curve of the arrangement as established for $K_2 = 4.10^{-8}/°C^2$ which is typical of a resonator vibrating in the fundamental bending mode in the crystallographic plane XY and for a temperature $T_h$ chosen to be 55° C.
Figure 6:
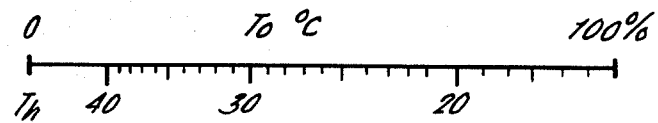
FIG. 6 shows the graduation of the corresponding scale for instrument 23. In these conditions if the precision of maintenance of the temperature $T_h$ is of $\pm 1°$ C and the coefficient $K_2$ be known to a precision of $+ 10\%$ the precision of the measure of $T_o$ will reach $\pm 2°$ in the neighborhood of 25°, a precision which is largely sufficient for most cases.

For resonators having a volume in the order of 0.1 cm$^3$ the apparatus carries out the determination of the inversion temperature in a time in the order of 1 minute. By comparison point by point determination according to the current procedure requires a time in the order of 1 hour.

It is clear that the heat source having the lower temperature $T_f$ may just as well serve as a reference or starting point for the determination. One would then use the relationship $T_o = T_f + \sqrt{\Delta/K_2}$. Since basically the precision of the reference temperature is determined and since it suffices that the other temperature relative thereto be situated on the other side of $T_o$ without precise knowledge thereof being of importance, it is preferred to use the higher temperature source as reference at the temperature $T_h$. This source may then be a heated plate at a temperature $T_h$ which is constant and easily reproducible, the other source being a cold plate for which it is simply known that the temperature is lower than the inversion point. This latter may be a plate cooled by the circulation of cold water for example.

I claim:

1. A process for determining the inversion temperature of a quartz piezoelectric resonator element comprising the steps of:
    applying exciting energy to the resonator element at a constant frequency corresponding to the resonant frequency thereof;
    bringing the resonator element to a temperature $T_h$ which is maintained constant and chosen to be either above or below the unknown inversion temperature $T_o$;
    determining the resonance frequency of the resonator element at said temperature $T_h$, and generating a second frequency $f_o$ equal the said determined resonance frequency, said frequency $f_o$ to be used as a standard of comparison for the subsequent measure of resonator frequency variations;
    bringing the resonator element to a temperature $T_f$ known to be respectively below or above the inversion temperature $T_o$ and generating an electrical signal representing the measure of the relative frequency spread $(f - f_o/f_o)$ while the temperature is varying from $T_h$ to $T_f$, $f$ being the frequency of the resonator element at any instant as the temperature is varying;
    detecting and storing an electrical manifestation of the maximum value of said electrical signal; and,
    utilizing said stored electrical manifestation of said maximum value to indicate the inversion temperature of said resonator element.

2. Apparatus for determining the inversion temperature of a piezoelectric resonator element, said apparatus comprising:
    a first heat source for producing a first temperature $(T_h)$ higher than the unknown inversion temperature;
    a second heat source for producing a second temperature $(T_f)$ lower than the unknown inversion temperature;
    means for bringing a resonator element into thermal contact with first one and then the other of said heat sources so that the temperature of said resonator element is brought to first one and then the other of said temperatures;
    means for exciting said resonator element to continuously vibrate at its resonance frequency, said exciting means producing an output signal representing said resonance frequency;
    controllable generator means for generating a reference signal representing the resonance frequency of said resonator element when it is at said one temperature;
    measuring means responsive to said output signal and said reference signal for measuring the frequency variation of said resonator element relative to its resonance frequency at said one temperature; and,
    detecting means responsive to said measuring means for detecting the maximum value of said frequency variation as the temperature of said resonator element changes from said one to said other temperature.

3. Apparatus as claimed in claim 2 wherein the means for bringing a resonator element into thermal contact with said first and second heat sources comprises:
    a slideway extending between said first and second heat sources; and,
    a cursor movable along said slideway and having means for retaining therein a resonator element whose inversion temperature is to be determined.

4. Apparatus as claimed in claim 3 wherein said cursor is provided with electrical contacts, said apparatus further including a flexible cable coupling the resonator element to said means for exciting the resonator element.

5. Apparatus as claimed in claim 2 wherein:
    said reference signal is a signal whose frequency represents the resonance frequency of said resonator element when it is at said one temperature;
    said output signal is a signal whose frequency represents the resonance frequency of the resonator; and,
    said measuring means comprises a frequency comparator means for generating a voltage representing the difference in frequency between said reference signal and said output signal.

6. Apparatus as claimed in claim 5 wherein said detecting means comprises:
    a diode;
    a capacitor;
    an amplifier;
    a switch;
    said diode being connected between said frequency comparator means and said capacitor to store on said capacitor the maximum value of said voltage; and,
    said switch being connected between said capacitor and said amplifier to discharge said capacitor into said amplifier when said switch is closed.

7. Apparatus as claimed in claim 6 and further comprising a moving coil instrument responsive to said amplifier and graduated to display the inversion temperature of a resonator element directly.

8. Apparatus as claimed in claim 2 wherein said generator means comprises a variable frequency oscillator and means for adjusting the frequency of said variable frequency oscillator to be equal to the resonance frequency of said resonator element at said one temperature.

9. Apparatus as claimed in claim 2 wherein:
said first heat source comprises a plate heated to a constant temperature and said second heat source comprises a liquid cooled plate whose temperature is maintained below the inversion temperature.

* * * * *